United States Patent
Park et al.

(10) Patent No.: US 9,490,061 B2
(45) Date of Patent: Nov. 8, 2016

(54) COIL COMPONENT AND BOARD HAVING THE SAME

(71) Applicant: SAMSUNG ELECTRO-MECHANICS CO., LTD., Suwon-Si, Gyeonggi-Do (KR)

(72) Inventors: Jong Ik Park, Suwon-Si (KR); Jin Mo Ahn, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/984,776

(22) Filed: Dec. 30, 2015

(65) Prior Publication Data

US 2016/0268039 A1   Sep. 15, 2016

(30) Foreign Application Priority Data

Mar. 9, 2015 (KR) .................. 10-2015-0032395

(51) Int. Cl.
| | |
|---|---|
| H01F 5/00 | (2006.01) |
| H05K 1/16 | (2006.01) |
| H01F 27/02 | (2006.01) |
| H01F 27/36 | (2006.01) |
| H01F 21/10 | (2006.01) |
| H01F 27/28 | (2006.01) |
| H01F 27/29 | (2006.01) |
| H05K 1/18 | (2006.01) |

(52) U.S. Cl.
CPC ........ *H01F 27/2804* (2013.01); *H01F 27/292* (2013.01); *H05K 1/181* (2013.01); *H05K 2201/1003* (2013.01)

(58) Field of Classification Search
CPC . H01F 27/2804; H01F 27/292; H01K 1/181; H05K 2201/1003
USPC ........... 174/260; 336/83, 84 R, 87, 200, 232
See application file for complete search history.

(56) References Cited

U.S. PATENT DOCUMENTS

| | | | | |
|---|---|---|---|---|
| 3,836,881 | A * | 9/1974 | Koizumi | H01P 1/205 333/202 |
| 5,198,647 | A * | 3/1993 | Mizuta | G06K 19/07749 235/449 |
| 6,114,938 | A * | 9/2000 | Iida | H01F 17/0006 257/531 |
| 2003/0085777 | A1* | 5/2003 | Kim | H01F 17/0013 333/185 |
| 2003/0134612 | A1* | 7/2003 | Nakayama | H01F 17/0013 455/307 |
| 2007/0205856 | A1* | 9/2007 | Matsunaga | H01F 17/0013 336/200 |
| 2010/0052838 | A1* | 3/2010 | Matsuta | H01F 17/0013 336/200 |

(Continued)

FOREIGN PATENT DOCUMENTS

| | | |
|---|---|---|
| JP | 2005-317775 A | 11/2005 |
| JP | 2009-218530 A | 9/2009 |
| KR | 10-2005-0011090 A | 1/2005 |

*Primary Examiner* — Sherman Ng
(74) *Attorney, Agent, or Firm* — McDermott Will & Emery LLP

(57) ABSTRACT

A coil component includes a magnetic body including first and second coil patterns disposed on first surfaces of two substrates spaced apart from each other and third and fourth coil patterns disposed on second surfaces of the two substrates, respectively, the substrates having respective cores; and first to fourth external electrodes disposed on outer surfaces of the magnetic body and connected to the first to fourth coil patterns, respectively. A gap member is disposed between the two substrates and in a central portion of the magnetic body in a thickness direction thereof.

16 Claims, 4 Drawing Sheets

(56) References Cited

U.S. PATENT DOCUMENTS

| | | | |
|---|---|---|---|
| 2013/0169399 A1* | 7/2013 | Yoo | H01F 17/0013 336/180 |
| 2013/0229253 A1* | 9/2013 | Inui | H01F 17/0033 336/200 |
| 2014/0022041 A1* | 1/2014 | Park | H01F 17/0013 336/199 |
| 2014/0184374 A1* | 7/2014 | Park | H01F 27/255 336/83 |
| 2015/0047888 A1* | 2/2015 | Yoon | H01F 17/0006 174/260 |

* cited by examiner

X-X`

COIL COMPONENT AND BOARD HAVING THE SAME

CROSS-REFERENCE TO RELATED APPLICATION

This application claims the priority and benefit of Korean Patent Application No. 10-2015-0032395, filed on Mar. 9, 2015 with the Korean Intellectual Property Office, the entirety of which is incorporated herein by reference.

BACKGROUND

The present disclosure relates to a coil component and a board having the same.

Transmitting and receiving data in a high-frequency band is a widely used function of electronic products such as digital television (TV) sets, smartphones, laptop computers, or the like. In the future, these information technology (IT) electronic products are also expected to be provided with multi-functionality and complex characteristics not only when used alone, but also when connected to other devices via a universal serial bus (USB) or a communications port.

In accordance with the development of smartphones, demand for a slim power inductor having high current, efficiency, performance, and small size has increased.

Therefore, a product having a size of 2016 (2.0 mm length and 1.6 mm width) and a thickness of 1 mm, which is smaller than a product having a size of 2520 (2.5 mm length and 2.0 mm width) and a thickness of 1 mm used in the past, has been currently used, and will be miniaturized to have a size of 1608 (1.6 mm length and 0.8 mm width) and a thickness of 0.8 mm in future.

Concurrently, demand for a power inductor array having advantages such as a reduced mounting area has also increased.

The power inductor array may have a non-coupled or coupled inductor form or a mixed form of the non-coupled inductor form, the coupled inductor form depending on a coupling coefficient or a mutual inductance between a plurality of coil patterns.

Therefore, power inductor array products have been released. However, due to various integrated chip (IC) operations, efficiency, and performance demands of customers, a product capable of controlling several kinds of coupling values has been required.

SUMMARY

An aspect of the present disclosure provides a coil component and a board having the same.

According to an aspect of the present disclosure, a coil component comprises a magnetic body including first and second coil patterns disposed on first surfaces of two substrates spaced apart from each other and third and fourth coil patterns disposed on second surfaces of the two substrates, respectively, the substrates having respective cores; and first to fourth external electrodes disposed on outer surfaces of the magnetic body and connected to the first to fourth coil patterns, respectively, wherein a gap member is disposed between the two substrates and in a central portion of the magnetic body in a thickness direction thereof.

The gap member may have a shape of a bar and extend to both side surfaces of the magnetic body in a width direction thereof.

The gap member may be an electroplated material.

The gap member may be made of the same material as that of the first to fourth coil patterns.

A protrusion part may be disposed on a side surface of at least one of the two substrates.

The first and second external electrodes may be input terminals, and the third and fourth external electrodes may be output terminals.

The first to fourth coil patterns may contain at least one selected from the group consisting of gold (Au), silver (Ag), platinum (Pt), copper (Cu), nickel (Ni), palladium (Pd), and alloys thereof.

The substrate may be a magnetic substrate.

According to another aspect of the present disclosure, a board having a coil component may include: a printed circuit board on which a plurality of electrode pads are disposed; and a coil component mounted on the printed circuit board, wherein the coil component includes: a magnetic body including first and second coil patterns disposed on first surfaces of two substrates spaced apart from each other and third and fourth coil patterns disposed on second surfaces of the two substrates, respectively; and first to fourth external electrodes disposed on outer surfaces of the magnetic body and connected to the first to fourth coil patterns, respectively, and the substrates have respective cores, and a gap member is disposed between the two substrates and is disposed in a central portion of the magnetic body in a thickness direction thereof.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
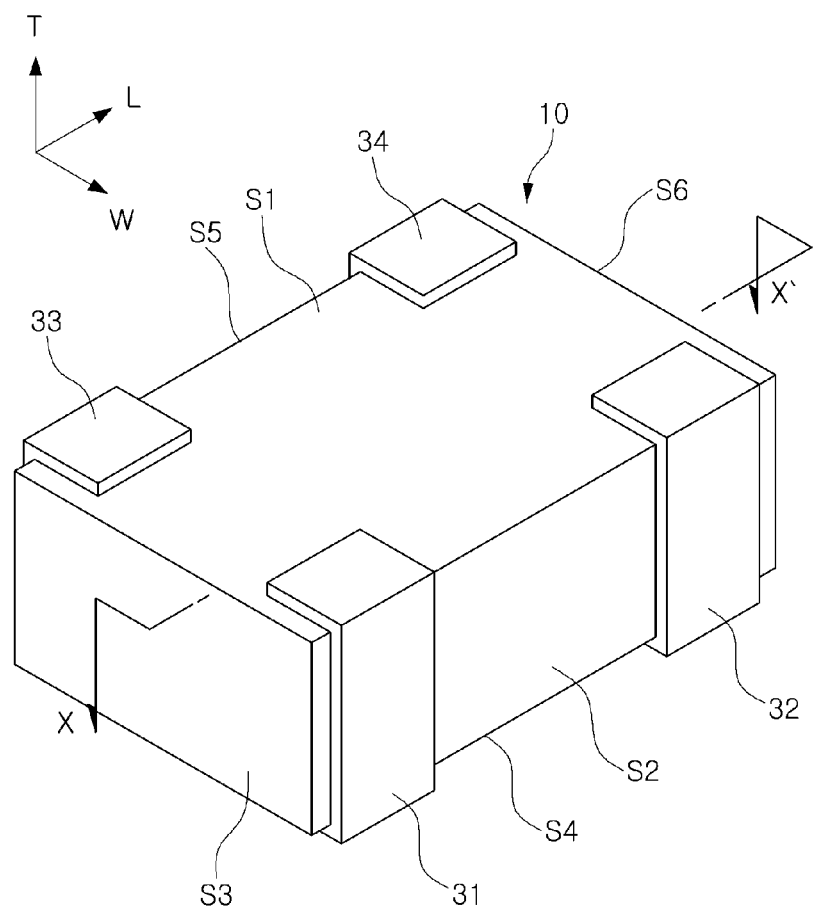
FIG. 1 is a perspective view of a coil component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Coil Component

FIG. 1 is a perspective view of a coil component according to an exemplary embodiment.

Figure 2:
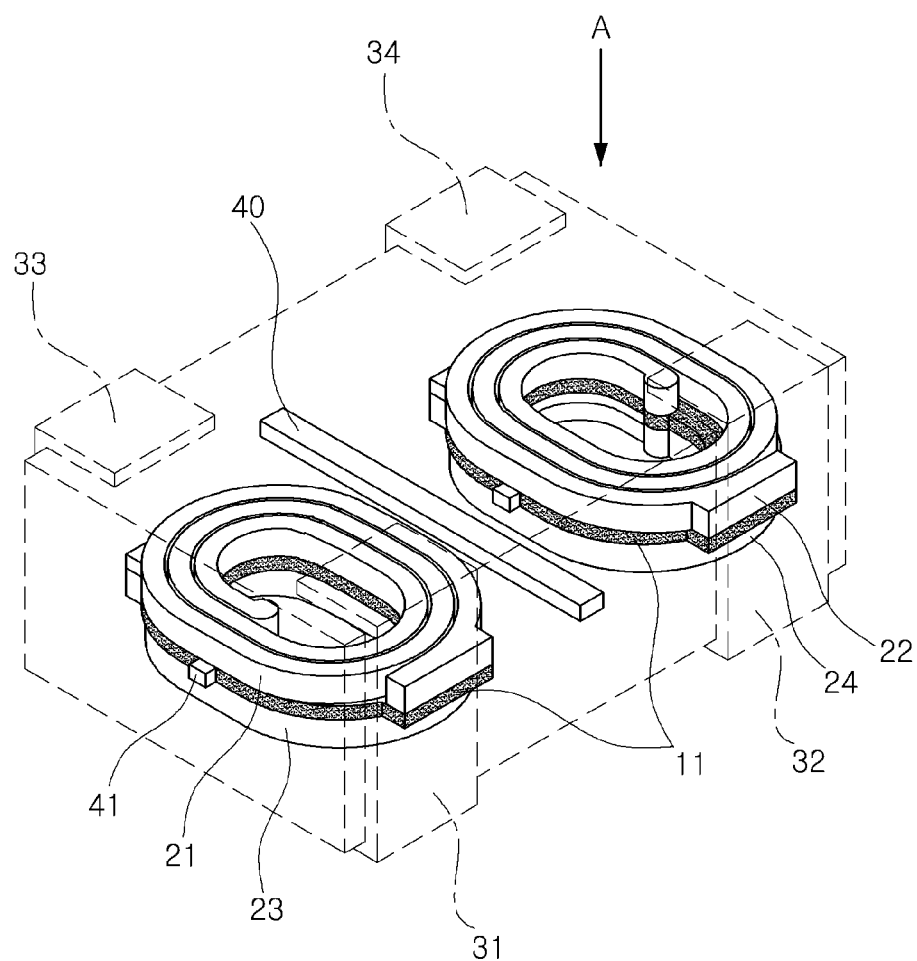
FIG. 2 is a perspective view of external electrodes and a magnetic body of the coil component according to an exemplary embodiment in the present disclosure.

FIG. 2 is a perspective view of external electrodes and a magnetic body of the coil component according to an exemplary embodiment.

Referring to FIGS. 1 and 2, the coil component may include a magnetic body 10 including first and second coil patterns 21 and 22 each disposed on first surfaces of two substrates 11 spaced apart from each other and having cores and third and fourth coil patterns 23 and 24 each disposed on second surfaces of the two substrates 11, and first to fourth external electrodes 31 to 34 disposed on outer surfaces of the magnetic body 10 and connected to the first to fourth coil patterns 21 to 24, respectively.

In the present exemplary embodiment, terms "first" to "fourth" are only to distinguish objects from each other, and are not limited to this sequence.

The magnetic body 10 may have a hexahedral shape, and an "L direction" refers to a "length direction", a "W direction" refers to a "width direction", and a "T direction" refers to a "thickness direction".

The magnetic body 10 may have upper and lower surfaces S1 and S4 opposing each other, first and second end surfaces S3 and S6 connecting the upper and lower surfaces S1 and S4 and opposing each other in the length direction, and first and second side surfaces S2 and S5 connecting the upper and lower surfaces S1 and S4 and opposing each other in the width direction.

The magnetic body 10 may include the two substrates 11 spaced apart from each other and having the cores, and may include the first and second coil patterns 21 and 22 and the third and fourth coil patterns 23 and 24 disposed on upper and lower surfaces of the two substrates 11, respectively, and enclosed by an insulating layer.

That is, the first and third coil patterns 21 and 23 may be disposed, respectively, on upper and lower surfaces of one substrate having the core, and the second and fourth coil patterns 22 and 24 may be disposed, respectively, on upper and lower surfaces of the other substrate having the core.

The shape of the magnetic body 10 may form the exterior of an inductor array and may be formed of any material that exhibits magnetic properties. For example, the magnetic body 10 may be formed by providing ferrite or a metal based soft magnetic material.

For the ferrite, an Mn—Zn based ferrite, an Ni—Zn based ferrite, an Ni—Zn—Cu based ferrite, an Mn—Mg based ferrite, a Ba based ferrite, an Li based ferrite, or the like, may be used.

The metal based soft magnetic material may be an alloy containing at least one selected from the group consisting of iron (Fe), silicon (Si), chromium (Cr), aluminum (Al), and nickel (Ni). For example, the metal based soft magnetic material may contain Fe—Si—B—Cr based amorphous metal particles, but is not limited thereto.

The metal based soft magnetic material may have a particle size of 0.1 μm to 30 μm and may be contained in a polymer such as an epoxy resin, polyimide, or the like, in a form in which it is dispersed in the polymer.

The substrate 11 may be a magnetic substrate, and a magnetic material contained in the magnetic substrate may include a nickel-zinc-copper ferrite, but is not necessarily limited thereto.

In addition, the coil component, according to an exemplary embodiment, may include the first and second external electrodes 31 and 32 formed on a first surface of the magnetic body 10 and the third and fourth external electrodes 33 and 34 formed on a second surface of the magnetic body 10 opposing the first surface of the magnetic body 10.

Next, the first to fourth coil patterns 21 to 24 and the first to fourth external electrodes 31 to 34, as well as a gap member 40, will be described.

Figure 3:
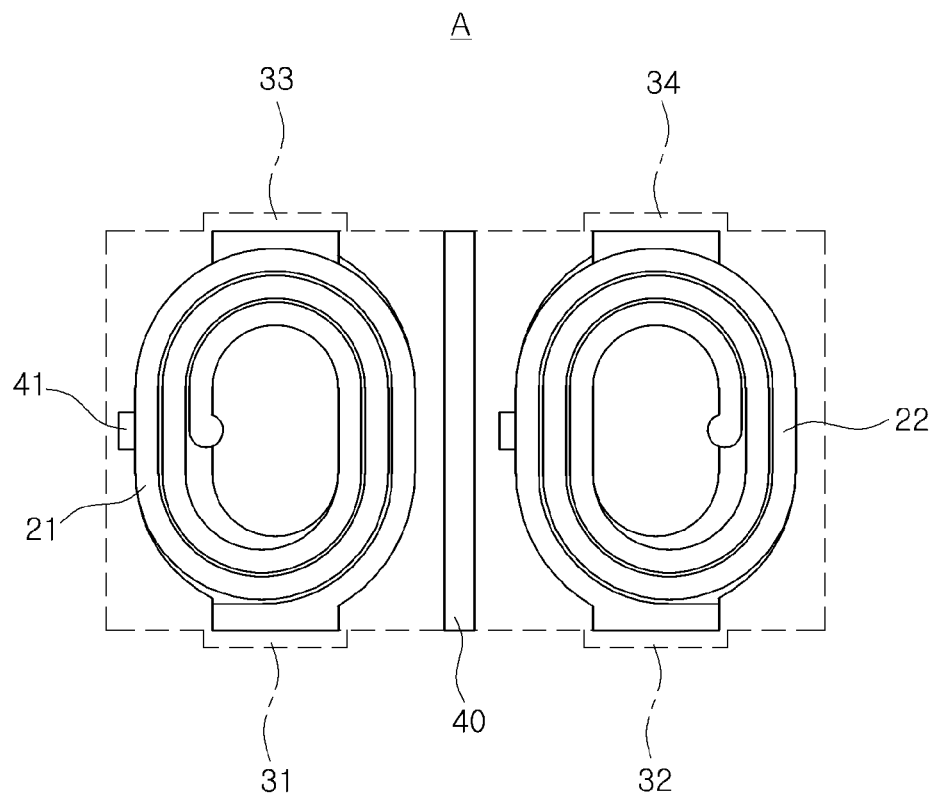
FIG. 3 is a plan view when viewed in direction A of FIG. 2.

FIG. 3 is a plan view when viewed in direction A of FIG. 2.

Figure 4:
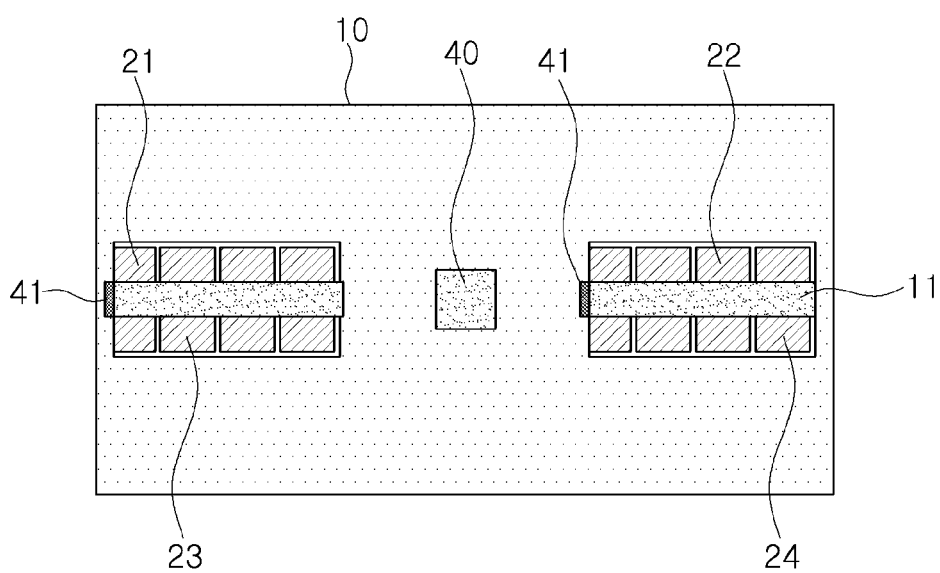
FIG. 4 is a cross-sectional view taken along line X-X' of FIG. 1.

FIG. 4 is a cross-sectional view taken along line X-X' of FIG. 1.

Referring to FIGS. 3 and 4, the first and second coil patterns 21 and 22 may be disposed on first surfaces of the substrate 11 to be spaced apart from each other and be in parallel with each other, and may be wound in a state in which they are spaced apart from each other in the length direction of the magnetic body 10 on the same plane.

In addition, the third and fourth coil patterns 23 and 24 may be disposed on second surfaces of the substrate 11 to be spaced apart from each other and be in parallel with each other, and may be wound in a state in which they are spaced apart from each other in the length direction of the magnetic body 10 on the same plane.

Therefore, a basic structure of the coil component, according to an exemplary embodiment, may be a coupled inductor array form, and the gap member 40 may be disposed in a central portion of the magnetic body 10 in the thickness direction, to be described below.

The first and second coil patterns 21 and 22 may be disposed to be symmetrical to each other in relation to the central portion of the magnetic body 10 in the length direction.

In addition, the third and fourth coil patterns 23 and 24 may be disposed to be symmetrical to each other in relation to the central portion of the magnetic body 10 in the length direction.

The first and second coil patterns 21 and 22 may have a symmetrical structure in which they are mirrored in relation to the central portion of the magnetic body 10, and the third and fourth coil patterns 23 and 24 may also have a symmetrical structure in which they are mirrored in relation to the central portion of the magnetic body 10.

The central portion of the magnetic body 10 is a central region of the magnetic body in the length direction, but need not be spaced apart from both end portions of the magnetic body 10 in the length direction by exactly the same distance.

When the first and second coil patterns 21 and 22 are wound, a magnetic center in each of the first and second coil patterns 21 and 22 is called a core.

In addition, in shapes in which the third and fourth coil patterns 23 and 24 are wound on the other surface of the substrate 11, a magnetic center may be called a core, and thus the substrate 11 may include two substrates each having cores.

According to an exemplary embodiment, since the first and second coil patterns 21 and 22 are symmetrical to each other in relation to the center of the magnetic body and the third and fourth coil patterns 23 and 24 are symmetrical to each other in relation to the center of the magnetic body, an inductance value formed by the first and second coil patterns 21 and 22 and an inductance value formed by the third and fourth coil patterns 23 and 24 may be the same.

In addition, ends of the first and second coil patterns 21 and 22 may be exposed to a first surface of the magnetic body 10 in the width direction, and ends of the third and fourth coil patterns 23 and 24 may be exposed to a second surface of the magnetic body 10 in the width direction, and thus the first to fourth coil patterns 21 to 24 may be connected to the first to fourth external electrodes 31 to 34, respectively.

That is, one end of the first coil pattern 21 may be exposed to a first surface of the magnetic body 10 in the width direction, and one end of the second coil pattern 22 on the same plane as the first coil pattern 21 may be exposed to the first surface of the magnetic body 10 in the width direction.

One end of the first coil pattern 21 exposed as described above may be connected to the first external electrode 31, and one end of the second coil pattern 22 exposed as described above may be connected to the second external electrode 32.

Likewise, one end of the third coil pattern 23 disposed on the lower surface of the substrate 11 may be exposed to a second surface of the magnetic body 10 in the width direction, and may be exposed to a position spaced apart from a position to which the fourth coil pattern 24 is exposed.

In addition, one end of the fourth coil pattern 24 disposed to be in parallel with and spaced apart from the third coil pattern 23 on the same plane as a plane on which the third coil pattern 23 is disposed may be exposed to the second surface of the magnetic body 10 in the width direction, and may be exposed to a position spaced apart from the position to which the third coil pattern 23 is exposed.

One end of the third coil pattern 23 exposed as described above may be connected to the third external electrode 33, and one end of the fourth coil pattern 24 exposed as described above may be connected to the fourth external electrode 34.

As described above, the first and second coil patterns 21 and 22 and the third and fourth coil patterns 23 and 24 may be exposed to first and second surfaces of the magnetic body 10, respectively, to be spaced apart from each other, respectively, and thus they may be connected to the first to fourth external electrodes 31 to 34, respectively.

The first and second external electrodes 31 and 32 may be input terminals, and the third and fourth external electrodes 33 and 34 may be output terminals, but are not necessarily limited thereto.

The first and second coil patterns 21 and 22 may be formed on the same plane, which is the upper surface of the substrate 11, the third and fourth coil patterns 23 and 24 may be formed on the same plane, which is the lower surface of the substrate 11, and the first and third coil patterns 21 and 23 may be connected to each other by a via (not illustrated).

Likewise, the second and fourth coil patterns 22 and 24 may be connected to each other by a via (not illustrated).

Current input from the first external electrode 31, which is the input terminal, may flow to the third external electrode 33, which is the output terminal, through the first coil pattern 21, the via, and the third coil pattern 23.

Likewise, current input from the second external electrode 32, which is the input terminal, may flow to the fourth external electrode 34, which is the output terminal, through the second coil pattern 22, the via, and the fourth coil pattern 24.

The first to fourth coil patterns 21 to 24 may contain one or more selected from the group consisting of gold (Au), silver (Ag), platinum (Pt), copper (Cu), nickel (Ni), palladium (Pd), and an alloy thereof.

The first to fourth coil patterns 21 to 24 may be formed of any material that may provide conductivity to a coil, and are not limited to being formed of the above-mentioned metals.

In addition, the first to fourth coil patterns 21 to 24 may have a polygonal shape, a circular shape, an oval shape, or an irregular shape. However, shapes of the first to fourth coil patterns 21 to 24 are not particularly limited.

The first to fourth coil patterns 21 to 24 may be connected to the first to fourth external electrodes 31 to 34 through lead terminals (not illustrated), respectively.

The external electrodes may include the first to fourth external electrodes 31 to 34.

The first to fourth external electrodes 31 to 34 may be extended in the thickness direction ("T direction") of the magnetic body 10.

The first to fourth external electrodes 31 to 34 may be disposed to be spaced apart from each other to thereby be electrically disconnected from each other.

The first to fourth external electrodes 31 to 34 may be extended to portions of the upper and lower surfaces of the magnetic body 10.

Since bonded portions between the first to fourth external electrodes 31 to 34 and the magnetic body 10 have an angle shape, adhesive force between the first to fourth external electrodes 31 to 34 and the magnetic body 10 may be increased, and performance enduring external impacts, or the like, may be improved.

A metal forming the first to fourth external electrodes 31 to 34 is not particularly limited as long as it may provide electrical conductivity to the first to fourth external electrodes 31 to 34.

In detail, the first to fourth external electrodes 31 to 34 may contain one or more selected from the group consisting of gold (Au), silver (Ag), platinum (Pt), copper (Cu), nickel (Ni), palladium (Pd), and an alloy thereof.

Gold (Au), silver (Ag), platinum (Pt), and palladium (Pd) are more expensive but stable, while copper (Cu) and nickel (Ni) are less expensive but may be oxidized during sintering, and thus electrical conductivity may be decreased.

In the coil component, the gap member 40 may be disposed in the central portion of the magnetic body 10 in the thickness direction to adjust an inductance value by interference between internal coils of a product.

As a result, various coupling values in a power inductor array product may be implemented.

That is, although the first and second coil patterns 21 and 22 are disposed to be spaced apart from each other, since magnetic fluxes generated in the first and second coil patterns 21 and 22 are affected by each other due to miniaturization of the power inductor array product, interference may be generated by the gap member 40 to adjust the inductance value, whereby various coupling values may be implemented.

According to an exemplary embodiment, the gap member 40 may have a bar shape extended to both side surfaces S2 and S5 of the magnetic body 10 in the width direction, but is not necessarily limited thereto.

A width, a height, and a material of the gap member 40 may be variously changed, whereby various coupling values may be implemented, if necessary.

The gap member 40 may be formed by, for example, plating, but is not necessary limited thereto.

The gap member 40 may be formed by an electroplating method that is the same as a method of forming the first to fourth coil patterns 21 to 24.

A material of the gap member 40 is not particularly limited, but may be the same material as that of the first to fourth coil patterns 21 to 24.

Therefore, the gap member 40 may contain one or more selected from the group consisting of gold (Au), silver (Ag), platinum (Pt), copper (Cu), nickel (Ni), palladium (Pd), and an alloy thereof.

According to an exemplary embodiment, protrusion parts 41 may be disposed on first side surfaces of the two substrates 11, respectively.

The protrusion parts 41 may be formed together with the substrates 11 at the time of manufacturing the substrates 11 or may be formed separately from the substrates 11 after the substrates 11 are manufactured.

The protrusion parts 41 may be disposed on first side surfaces of the two substrates 11 to generate interference in a magnetic flux between the first and third coil patterns 21 and 23, thereby adjusting an inductance value. Therefore, various coupling values may be implemented, if necessary.

Likewise, interference may also be patterns in a magnetic flux between the second and fourth coil patterns 22 and 24 due to the protrusion parts 41 to adjust an inductance value. Therefore, various coupling values may be implemented, if necessary.

A thickness of the magnetic body 10 may be 1.2 mm or less. However, a thickness of the magnetic body 10 is not limited thereto, and may vary.

Board Having Coil Component

Figure 5:
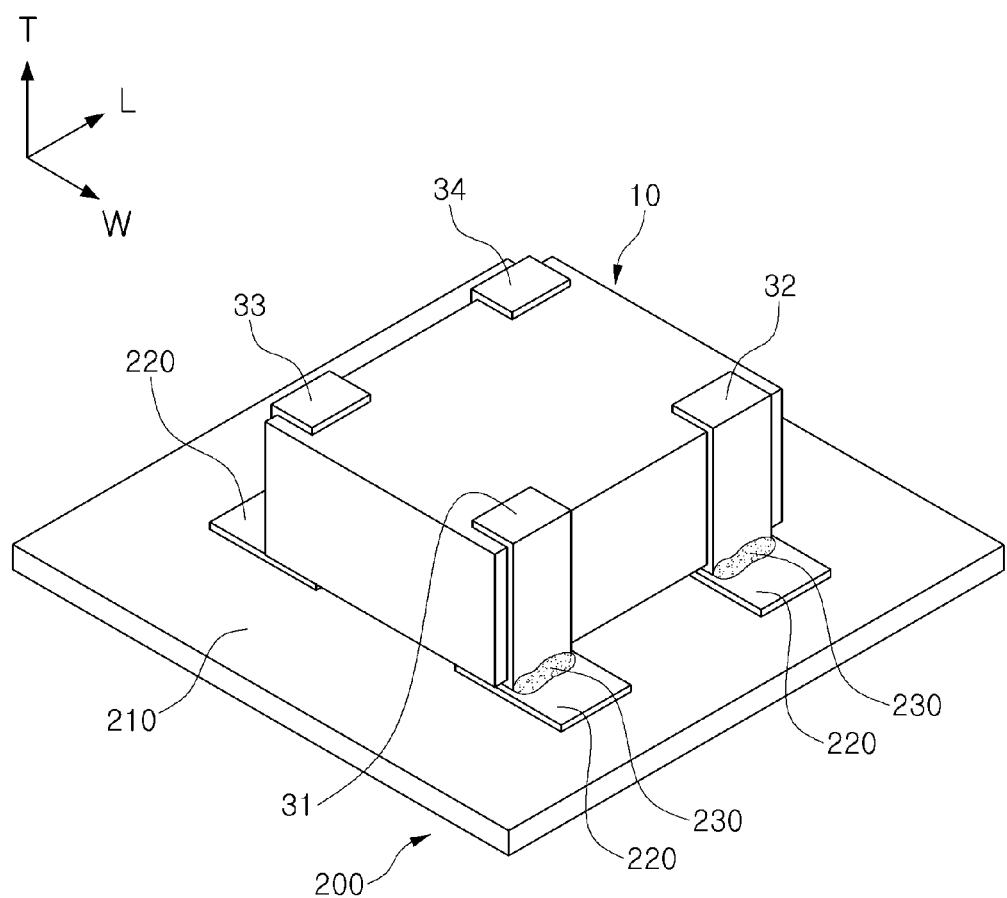
FIG. 5 is a perspective view illustrating a board in which the coil component of FIG. 1 is mounted on a printed circuit board.

FIG. 5 is a perspective view illustrating a form in which the coil component of FIG. 1 is mounted on a printed circuit board.

Referring to FIG. 5, a board having a coil component according to the present exemplary embodiment may include a printed circuit board 210 on which the coil component is mounted in parallel with a circuit board, and a plurality of electrode pads 220 formed on an upper surface of the printed circuit board 210 to be spaced apart from each other.

The coil component may be electrically connected to the printed circuit board 210 by solders 230 in a state in which the first to fourth external electrodes 31 to 34 thereof are positioned on the electrode pads 220, respectively, to contact the electrode pads 220, respectively.

A description of features overlapping those of the coil component according to the exemplary embodiment described above except for the above-mentioned description will be omitted.

As set forth above, in the coil component according to an exemplary embodiment, the gap member may be disposed in the central portion of the magnetic body in the thickness direction to adjust an inductance value by interference between internal coils of a product.

As a result, various coupling values in a power inductor array product may be implemented.

While exemplary embodiments have been shown and described above, it will be apparent to those skilled in the art that modifications and variations could be made without departing from the scope of the present invention as defined by the appended claims.

What is claimed is:

1. A coil component comprising:
 a magnetic body including first and second coil patterns disposed on first surfaces of two substrates spaced apart from each other and third and fourth coil patterns disposed on second surfaces of the two substrates, respectively, the substrates having respective cores; and
 first to fourth external electrodes disposed on outer surfaces of the magnetic body and connected to the first to fourth coil patterns, respectively,
 wherein a gap member is disposed between the two substrates and in a central portion of the magnetic body in a thickness direction thereof.

2. The coil component of claim 1, wherein the gap member has a shape of a bar and extends to both side surfaces of the magnetic body in a width direction thereof.

3. The coil component of claim 1, wherein the gap member is an electroplated material.

4. The coil component of claim 1, wherein the gap member is made of the same material as that of the first to fourth coil patterns.

5. The coil component of claim 1, wherein a protrusion part is disposed on a side surface of at least one of the two substrates.

6. The coil component of claim 1, wherein the first and second external electrodes are input terminals, and
 the third and fourth external electrodes are output terminals.

7. The coil component of claim 1, wherein the first to fourth coil patterns contain at least one selected from the group consisting of gold (Au), silver (Ag), platinum (Pt), copper (Cu), nickel (Ni), palladium (Pd), and alloys thereof.

8. The coil component of claim 1, wherein the substrate is a magnetic substrate.

9. A board, comprising:
 a printed circuit board on which a plurality of electrode pads are disposed; and
 a coil component mounted on the printed circuit board,
 wherein the coil component includes:
 a magnetic body including first and second coil patterns disposed on first surfaces of two substrates spaced apart from each other and third and fourth coil patterns disposed on second surfaces of the two substrates, respectively; and
 first to fourth external electrodes disposed on outer surfaces of the magnetic body and connected to the first to fourth coil patterns, respectively,
 the substrates have respective cores, and
 a gap member is disposed between the two substrates and in a central portion of the magnetic body in a thickness direction thereof.

10. The board of claim 9, wherein the gap member has a shape of a bar and extends to both side surfaces of the magnetic body in a width direction thereof.

11. The board of claim 9, wherein the gap member is an electroplated material.

12. The board of claim 9, wherein the gap member is made of the same material as that of the first to fourth coil patterns.

13. The board of claim 9, wherein a protrusion part is disposed on a side surface of at least one of the two substrates.

14. The board of claim 9, wherein the first and second external electrodes are input terminals, and
 the third and fourth external electrodes are output terminals.

15. The board of claim 9, wherein the first to fourth coil patterns contain at least one selected from the group consisting of gold (Au), silver (Ag), platinum (Pt), copper (Cu), nickel (Ni), palladium (Pd), and alloys thereof.

16. The board of claim 9, wherein the substrate is a magnetic substrate.

* * * * *